INVENTORS
LUCIEN BABANY
SERGE SIBON
BY Paul M. Craig, Jr.
ATTORNEY

INVENTORS
LUCIEN BABANY
SERGE SIBON
BY Paul M. Craig, Jr.
ATTORNEY

INVENTORS
LUCIEN BABANY
SERGE SIBON
BY Paul M Craig, Jr.
ATTORNEY

INVENTORS
LUCIEN BABANY
SERGE SIBON
BY Paul M. Craig, Jr.
ATTORNEY 3,205,451

FREQUENCY SYNTHESIZERS WITH SEARCH SWEEP OF CONTROLLED OSCILLATOR

Lucien Babany, Blanc-Mesnil, and Serge Sibon, Paris, France, assignors to Compagnie Industrielle des Telephones, Paris, France Filed Jan. 3, 1962, Ser. No. 164,068
Claims priority, application France, Feb. 1, 1961, 851,368
3 Claims. (Cl. 331—4)

The invention relates to high-stability frequency generators in which the desired frequency is directly posted by means of keys which have the effect, on the one hand, of selecting stabilized frequencies of the various decimal orders, and on the other hand of bringing a continuously variable oscillator in to the operating range of a device which effects the servocontrol of the frequency of the said continuously variable oscillator in accordance with the frequency resulting from the combination of the stabilized frequencies, so as finally to obtain an output frequencc equal to the decimal value posted by the keys, with a relative approximation equal to that of the individual stabilized frequencies.

These apparatus, which are called frequency synthesizers, are particularly useful in modulated-wave receivers having a single sideband, while being capable of finding applications in other fields of the transmissions art. In their French Patent No. 1,259,030 entitled: "Improvements in Frequency-Stabilized Electro-Magnetic Oscillation Generators (Invention Leon Berman)," applicants have described the essential features of an apparatus of this type.

In this apparatus, the exploration of the frequency range is effected by an electromechanical control.

It is advantageous to replace such a control by an electronic control without any movable members, by means of which it is possible to effect the exploration and locking more rapidly and with lighter and less cumbersome apparatus, which is a particularly valuable advantage in the case of apparatus operating aboard aircraft.

Consequently, there is employed in the invention an electronically variable frequency exploring device, which brings the frequency of a continuously variable oscillator in to the operating range of a frequency locking device, the actuation of which, when the exploring device has been stopped, ensures maintenance of the output frequency at the value of the reference frequency. The invention relates more particularly to the automatic control of the starting and stopping of the exploring device and to the ancillary means which ensure operation thereof under the best conditions of stability and efficiency.

Figure 1:
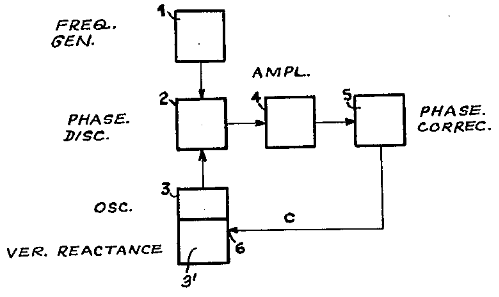
FIG. 1 PRIOR ART

The device according to the invention will be described with reference to the accompanying figures, in which there ar shown, respectively:

FIGURE 1, a known automatic frequency control system.

Figure 2:
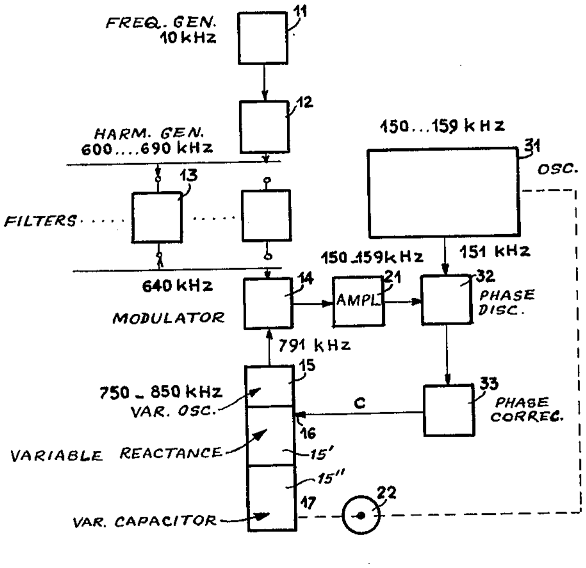
FIG. 2 PRIOR ART

FIGURE 2, an application of the automatic frequency control to the case of the locking of a continuously variable oscillator at a high-stability frequency which is a harmonic of a quartz-stabilized oscillator, which device forms the basis of the frequency synthesizer.

Figure 3:
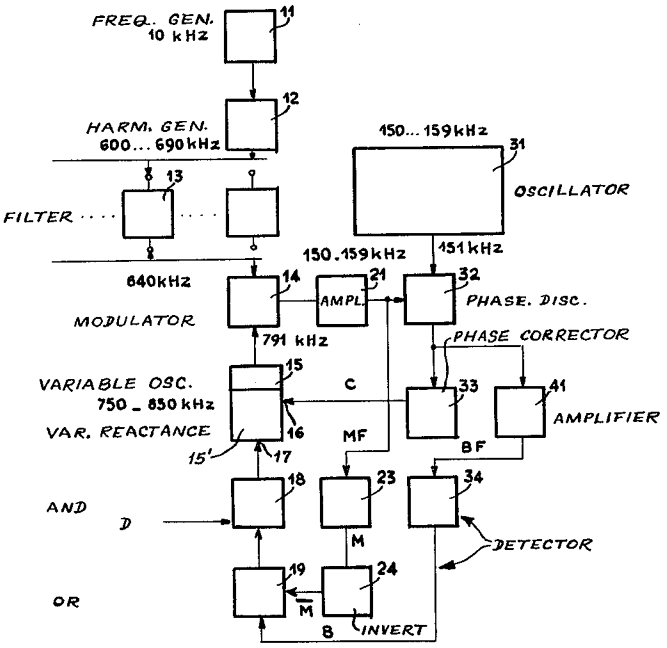

FIGURE 3, a functional diagram incorporating the automatic system for starting and stopping the frequency exploration according to the invention.

Figure 4:
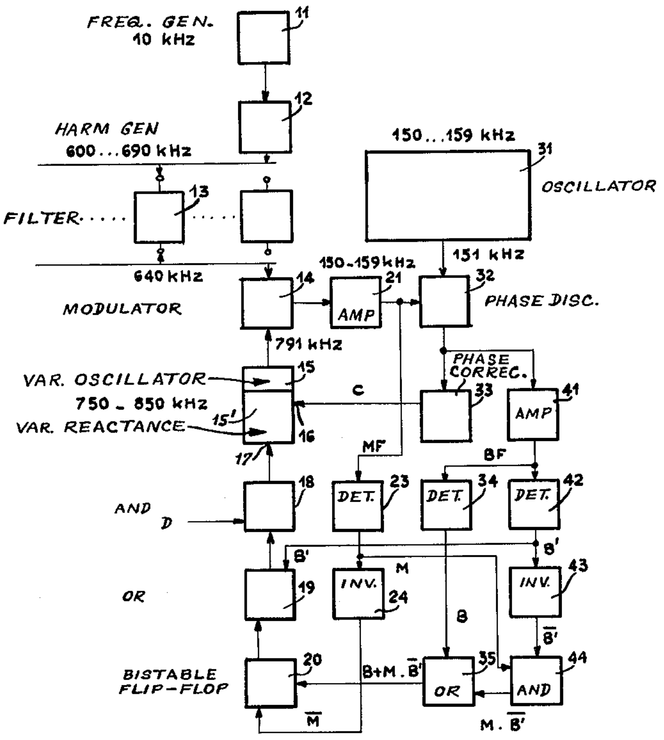

FIGURE 4, a functional diagram incorporating improvement in the preceding system, which ensure better conditions of efficiency of the device.

Figure 5:
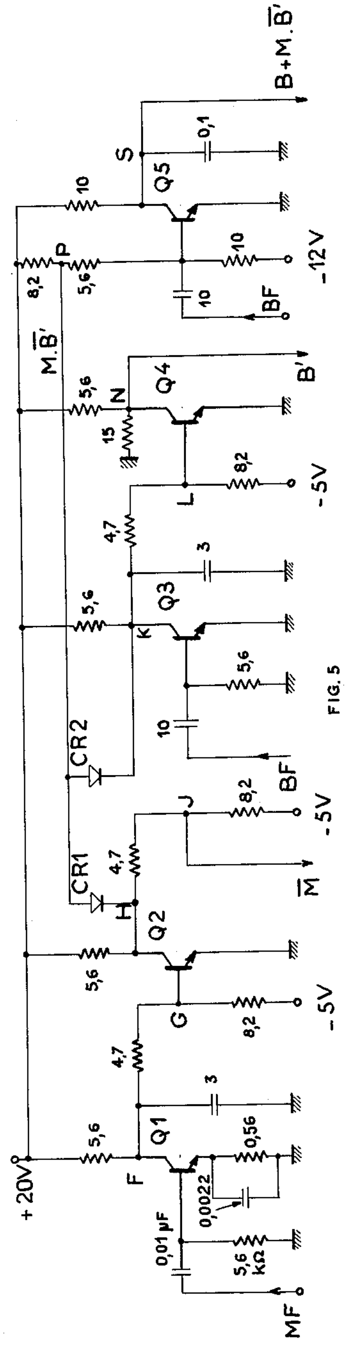
Figure 6:
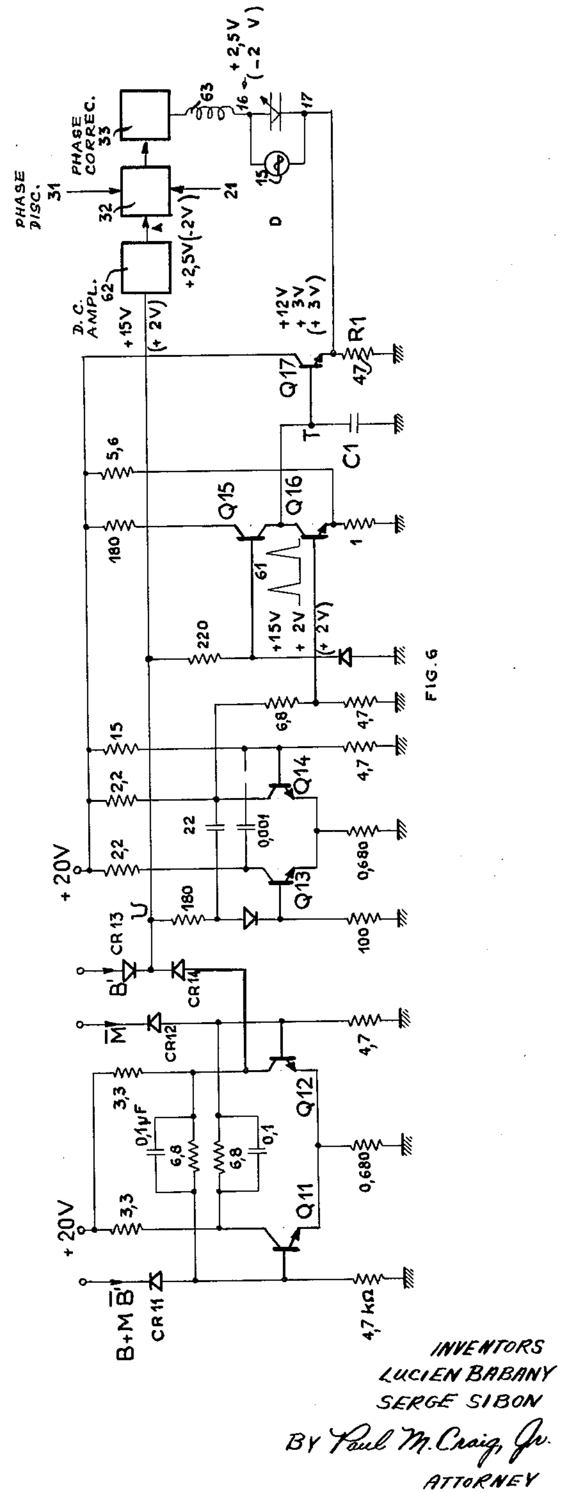

FIGURES 5 and 6, diagrams showing certain characteristics of the operation of the device.

FIGURES 1 and 2 are given as an introduction to the description of the invention, and contain only known devices.

In order that the operation of the device according to the invention may be readily understood, there has been illustrated in FIGURE 1 a known automatic frequency control system. 1 denotes a highly stable source of frequency F1. 3 denotes an oscillator whose frequency F2 is to be synchronized with F1. 1 and 3 are connected to a phase discriminator 2, of which the output voltage is an increasing function of the phase shift between the two frequencies F1 and F2, and consitutes the error signal. The error signal is amplified by an amplifier 4 and injected into a phase corrector 5, the outputs of which are connected by the link "C" to a variable reactance element, forming a part of the oscillator 3. This variable reactance has been schematically represented in FIGURE 1 by the portion 3' of block 3, said portion having a control terminal 6. The variable reactance is preferably a variable capacitance diode or varactor and is used to control the value of the frequency of the oscillator. The phase corrector 5 having a stabilizing effect, shifts the frequency F2 in the desired direction and by the required amount to bring it in to, and to maintain it in, synchronism with F1.

Synchronization is possible only if the frequency F2 is previously brought, by an external action, to a value F'2 in the neighborhood of F1. If F'1 and F"1 are the limits between which F'2 must be situated, the difference F"1—F'1 characterises the quality of the automatic frequency control, which quality is higher as F"1—F'1 is greater.

In a frequency synthesizer of the type in which improvements are provided by the invention, the locking system preferably takes the form of FIGURE 2. In this figure, 11 denotes a quartz-stabilized frequency generator whose frequency is equal, for example to 10 kc./s. 12 denotes a harmonic generator, of which one of the narrow-band filters 13 selects a radiation, for example 640 kc./s., the complete set of ten filters selecting the frequencies 600, 610 . . . 690 kc./s. 15 is a variable oscillator covering, for example, the continuous band 750–850 kc./s., the frequency being controlled by a variable reactance element such as a varactor, schematically represented by the portion 15' of block 15 and having a control terminal 10 and by a variable condenser driven by an electric motor 22. The frequency delivered by the oscillator 15, for example, 791 kc./s., is mixed in a modulator 14 with the radiation (640 kc./s.) selected by the band-pass filter 13. A medium-frequency amplifier 21, whose pass band is fixed, for example, at the band 150–159 kc./s., applies the amplified beat frequency F (791–640=151 kc./s. at synchronism) to a phase discriminator 32, which receives at its other input one of the ten frequencies 150 to 159 kc./s., stabilized by quartz, which are supplied by an oscillator 31, i.e. 151 kc./s. in the case of the figure. The output signal of the discriminator, after having passed through a phase corrector 33, acts through the link "C" on the variable-reactance element (for example a varactor) through the terminal 16, the whole arrangement maintaining the output frequency F2 of the oscillator 15 at the value defined by the filter and the quartz which have been selected, i.e. 791 kc./s. in the case of the figure. The locking device operates only if the frequency F'2 has previously been brought in to the zone of synchronism by an external action, for example by means of a variable condenser which is positioned by an electric motor 22 under the action of the selection control of the quartz of the oscillator 31. This pre-condition having been satisfied, there leaves the discriminator 32 a low-frequency beat whose application to the control terminal 16 imparts to the oscillator 15 a frequency modulation which tends to reduce the height of this beat, and which ceases as soon as synchronization is established.

According to the invention, a frequency sweep is applied to the oscillator 15 by an action applied only to the varactor by an external means. The device is illustrated in FIGURE 3, in which the same reference numerals denote the same members as in FIGURE 2. In the present case, however, in contradistinction to the known frequency synthesizer art, the adjustment of the frequency of the oscillator 15 in to the operating range of the discriminator 32 is effected by the action of a sawtooth voltage D on the varactor. This sawtooth is produced by known means, for example integration of the pulses emanating from a multivibrator by means of a condenser. In one embodiment of the invention, the recurrence frequency of the sawtooth has been made equal to about 3 seconds. The saw tooth is applied to one terminal of the varactor (terminal 17) by an "AND" gate 18. The opening of this gate is effected by the output signal from the "OR" circuit 19, which receives at one of its inputs a signal "$\overline{M}$" and at the other a signal "B." The signal "$\overline{M}$" is obtained by the passage through an inverter 24 of the signal M emanating from the rectification of the alternating medium-frequency signal MF by a detector 23. The signal B is obtained by rectification, by means of a detector 34, of the low-frequency signal BF leaving an amplifier 41.

The amplification produced in the circuits is such that, theoretically, as soon as a medium-frequency or low-frequency signal appears, the signals M or B reach the saturation level, to which the value 1 can conventionally be assigned. The signals M, $\overline{M}$, B, $\overline{B}$, therefore theoretically have either the value 0 or the value 1.

One of the normal processes of synchronization develops as follows:

In the absence of medium-frequency signal at the output of the amplifier 21, the signal M has the value 0, and the signal $\overline{M}$ the value 1. This "1," when applied to the "AND" circuit 18, has the effect of applying the sawtooth voltage "D" to the varactor. The frequency F2 of the oscillator 15 therefore commences its change. In order to give a clear idea of this, it will be assumed that it increases. Starting at a relatively low value, a time arrives when, owing to mixing with the frequency selected by the band-pass filter 13, it gives a component situated in the pass band of the amplifier 21. On the other hand, when the frequency F'2 has increased sufficiently to set up in the amplifier 41 a low-frequency beat, there is set up at the input of the "OR" circuit 19 a signal B. Although the medium-frequency signal "MF" precedes the low-frequency signal "BF," the existence of a further amplification in the network BF (amplifier 41), on the one hand, and the relatively low value of the time constant $\tau$ of the detector 34 ($\tau$ is of the order of 1 ms.) in relation to the time constant of the detector 23 ($15\tau$), on the other hand, have the effect of causing the almost simultaneous occurrence of the signals $\overline{M}=0$ and $B=1$. Consequently, the AND circuit 18 is henceforth kept open, not owing to the non-existence of the signal M, but owing to the existence of the signal B.

As the frequency F'2 continues to increase, synchronism is reached: the signal BF vanishes and the signal B returns to zero. As it is the latter which now controls the opening of the AND circuit 18, this gate closes, the sawtooth stops and synchronism is maintained by the servo-control supplied by the link "C" between the output of the phase shifter 33 and the terminal 16 of the varactor.

This operation can be represented in symbolic form in the following table:

| | (1) | (2) | (3) | (4) | (5) | (6) | (7) | (8) | (9) |
|---|---|---|---|---|---|---|---|---|---|
| (A) 1 | 0 | 0 | 1 | 0 | 0 | 1 | 0 | 1 | 0 |
| 2 | 1 | 1 | 0 | 1 | 1 | 1 | 1 | 1 | 0 |
| 3 | 1 | 1 | 0 | 0 | 0 | 0 | 0 | 0 | 1 |

In this table, the numbers of the columns refer to the signals or functions indicated in the following:

(1): Alternating medium-frequency signal MF. This signal has a zero value or a maximum value which is designated "1." It may in some cases take an intermediate value. (2): Logical signal emanating from MF by rectification, i.e. M. (3): Inverse, of M, or $\overline{M}$. (4): Alternating low-frequency signal BF, which can take the value 0 or "1," like MF, or in some cases an intermediate value. (5): Logical signal emanating from BF by rectification, i.e. B. (6): $\overline{M}+B=(3)+(5)$. (7): Denotes the taking over of the control of the sawtooth by B; 0 means "control not taken over," 1 means "control taken over." (8): Sawtooth 0 means "sawtooth stopped," 1 means "sawtooth in operation." (9): Synchronization; 0 means "no synchronization," 1 means "synchronization."

In another process, synchronism is obtained by way of an extremely brief signal BF, $\delta(t)$, which is so short that the logical signal B has not the time to form. This is the case, more especially, when synchronism is produced on the "return" part of the sawtooth. The operations take place in accordance with Table (B).

| | (1) | (2) | (3) | (4) | (5) | (6) | (7) | (8) | (9) |
|---|---|---|---|---|---|---|---|---|---|
| (B) 1 | 0 | 0 | 1 | 0 | 0 | 1 | 0 | 1 | 0 |
| 2 | 1 | 1 | 0 | $\delta(t)$ | 0 | 0 | 0 | 0 | 1 |
| 3 | 1 | 1 | 0 | 0 | 0 | 0 | 0 | 0 | 1 |

In the second phase, synchronism already exists, without the stage of the "taking over of the sawtooth by B" having been passed.

However, it may also happen that the signal BF appears in stable fashion, but remains at too low a level $\epsilon$ for B to be able to take the logical value 1. The condition $\overline{M}=0$ stops the sawtooth, but there is no taking over of control. The exploration stops before synchronism is reached. Under these conditions, the frequency of the oscillator 15 returns to its quiescent value, the result of which is that the useful output frequency of the modulator 14 is brought out of the pass band of the amplifier 21, and the signal M is gradually caused to disappear. This disappearance is relatively slow owing to the time constant of the detection circuit 23. We then have the following table:

| | (1) | (2) | (3) | (4) | (5) | (6) | (7) | (8) | (9) |
|---|---|---|---|---|---|---|---|---|---|
| (C) 1 | 0 | 0 | 1 | 0 | 0 | 1 | 0 | 1 | 0 |
| 2 | 1 | 1 | 0 | $\epsilon$ | 0 | 0 | 0 | 0 | 0 |
| 3 | 0 | 0 | 1 | 0 | 0 | 1 | 0 | 1 | 0 |

Therefore, at the end of a relatively long waiting period (several seconds), an exploration will be recommenced, which has no greater chance of succeeding than the preceding one.

In this case, there exists an imperfection in the device, which is obviated in the preferred form of the invention by additions to the preceding diagram.

The completed diagram is illustrated in FIGURE 4. It comprises, in addition to the elements of FIGURE 3, here denoted by the same numerical indices, the following elements: a bistable flip-flop 20, a low-frequency detector 42 having a large time constant ($15\tau$), which supplies the continuous signal B', an inverter 43, an AND circuit 44, which forms the logical product "M.$\overline{B}$" when acted upon at one of its inputs by the signal M and at the other by the signal $\overline{B}'$, an OR circuit 35, which produces the return to zero of the flip-flop 20 under the effect of the combined signal "$B+M.\overline{B'}$" when acted upon at one input by the signal M.$\overline{B}'$ and at the other by the signal B supplied from the signal BF by the detector 34 having a small time constant ($\tau$), the "1" being set up at the output of this flip-flop under the effect of the signal $\overline{M}$. The OR circuit 19 this time transmits to the gate 18 either the output signal of the flip-flop 20 or the signal B′ emanating from the output of the detector 42 having a large time constant.

The stages of the operation may also be represented by a table in which the designations of the columns correspond to the following signals or functions:

(1): MF, (2): M, (3): $\overline{M}$, (4): BF, (5): B, (6): B′, (7):$\overline{B'}$, (8): $M.\overline{B'}$=(2). (7), (9)$B+M.\overline{B'}$=(5)+(8), (10): State of the bistable flip-flop, operative T or inoperative R, (11): Taking over of the control of the sawtooth by B′, (12): Sawtooth, (13): Synchronization.

There will first be considered the case (A): low frequency of considerable amplitude.

| | (1) | (2) | (3) | (4) | (5) | (6) | (7) | (8) | (9) | (10) | (11) | (12) | (13) |
|---|---|---|---|---|---|---|---|---|---|---|---|---|---|
| (A) 1 | 0 | 0 | 1 | 0 | 0 | 0 | 1 | 0 | 0 | T | 0 | 1 | 0 |
| 2 | 1 | 1 | 0 | 1 | 1 | 1 | 0 | 0 | 1 | R | 1 | 1 | 0 |
| 3 | 1 | 1 | 0 | 0 | 0 | 0 | 1 | 1 | 1 | R | 0 | 0 | 1 |

It will here be seen that the return of the flip-flop to the inoperative position is produced by the term $B=1$ of the logical sum ($B+M.\overline{B'}$). It is followed by taking over by B′ until synchronism.

In the case (B), transient low frequency, we have the following table:

| | (1) | (2) | (3) | (4) | (5) | (6) | (7) | (8) | (9) | (10) | (11) | (12) | (13) |
|---|---|---|---|---|---|---|---|---|---|---|---|---|---|
| (B) 1 | 0 | 0 | 1 | 9 | 0 | 0 | 1 | 0 | 0 | T | 0 | 1 | 0 |
| 2 | 1 | 1 | 0 | δ(t) | 0 | 0 | 1 | 1 | 1 | R | 0 | 0 | 1 |
| 3 | 1 | 1 | 0 | 0 | 0 | 0 | 1 | 1 | 1 | R | 0 | 0 | 1 |

On comparison with the preceding case, it will be seen that the flip-flop is here returned to the inoperative state by the term $M.\overline{B'}=1$ of the logical sum ($B+M.\overline{B'}$). This shows the essential function performed by the two quiescent controls applied to the flip-flop.

In the case previously denoted by (C), in which there co-exists with a normal signal MF a signal BF which remains weak in the absence of synchronization, the output signals of the detectors 34 and 42, of which the value is intermediate between 0 and 1, no longer have the logical values B, B′ or $\overline{B'}$, essentially related to the values 0 or 1 of these signals. Therefore, the illustration of the operation of the device by the logical diagram, which is clear and convenient in the preceding cases, is no longer possible here.

In order to illustrate the operation of the device in the case (C), reference will be made to the basic diagram of FIGURE 5, and one of the cases (A) or (B) will first be considered.

This diagram comprises three sets of transistors (Q1, Q2), (Q3, Q4) and Q5, and a set of two rectifiers CR1 and CR2, as also the associated circuit elements. The first set of transistors (Q1, Q2), energized on the basis of Q1 by the signal MF, supplies at the point J, after direct-current rectification and amplification, the signal of logical value $\overline{M}$. It corresponds to the detector 23 of FIGURE 4. The second set of transistors (Q3, Q4) energized at their input by the signal BF, supplies at the point N, after direct-current rectification and amplication (detector 42 of FIGURE 4), the signal of logical value B′. The rectifiers CR1, CR2 serve to produce the logical product $M.\overline{B'}$ (AND) circuit 44 of FIGURE 4 in the form of a direct voltage set up at the point P. The transistor Q5 is energized on the one hand by the signal BF which it rectifies (detector 34 having a small time constant of FIGURE 4), and is on the other hand subjected to direct-current control by the signal M$\overline{B}$, applied to the point P there is obtained at the output S, a signal which has the logical value $B+M.\overline{B'}$ (OR circuit 35 of FIGURE 4). The transistor Q4 performs the function of the inverter 43.

It is to be noted that in the output circuit of the transistor Q2, a signal of logical value M is obtained at the point H (supplying $M.\overline{B'}$ at the point P), and a signal of logical value $\overline{M}$ at the point J: the inverter 24 of FIGURE 4 does not physically exist. This is due to the nature of the logical circuits employed, and in particular to the control of the bistable flip-flop 20, and the analysis of the operation of the circuits given in the following explains this feature.

The direct voltages have the following values in volts at the various points of the circuit:

| | F | G | H | J |
|---|---|---|---|---|
| Presence MF | +2 | −2 | +15 | +8 |
| Absence MF | +15 | +0.5 | 0 | [1] −2 |

| | K | L | N |
|---|---|---|---|
| Presence BF | 0 | −2 | +15 |
| Absence BF | +15 | +0.5 | 0 |

| | P |
|---|---|
| Presence MF and absence BF | +15 |
| Presence or absence MF or presence BF | { 0 S |
| Presence B or M.$\overline{B'}$ | [2] 0 |
| Absence B and M.$\overline{B'}$ | +20 |

[1] Operation of the flip-flop.
[2] Inoperative state of the flip-flop.

The bistable flip-flop 20 (FIGURE 4) changes its state on application of a signal of value lower than or equal to +3 volts for at least 20 milliseconds. Since the absence of the signal M sets up at the "operating" input of the flip-flop a voltage of −2 volts, against +8 volts in the presence of M, it is in fact the signal $\overline{M}$ which renders the flip-flop operative.

In the presence of MF ($H$=+15 v.) and in the absence of BF ($N$=+15 v.), there are 15 volts at the point P: this is the signal $M.\overline{B'}$.

In the presence of B or of $M.\overline{B'}$, there is obtained at

S a bias of 0 volt, which, when applied to the "quiescent" input of the bistable flip-flop 20 renders this flip-flop inoperative.

These are the conditions when the signal BF has sufficient strength for the signals B and $M.\overline{B'}$ to have the logical value 0 or 1.

In the inverse case, hereinbefore denoted by (C), the voltage values are intermediate, and there will exist at the points neither 0 nor +20 volts, but an intermediate value, for example +5 volts. At the same time, there is a normal signal MF which brings the point J to a voltage of +8 volts.

Under these conditions, there is no "operation" control at the flip-flop, and there is also no "quiescent" control. Owing to its storage function, the flip-flop retains its previous state, that is to say, it allows the passage of the sawtooth. The exploration will therefore continue until synchronism. At this instant, the flip-flop is rendered inoperative by the condition $M.\overline{B'}=1$.

It will therefore be seen that owing to the device illustrated by the diagram of FIGURE 4, synchronism and stoppage of the frequency exploration are obtained in all cases which may arise in practice.

Some constructional details, which are important for a good operation of the device, will be explained with reference to FIGURE 6. FIGURE 6 is a mixed, half-functional and half-technological diagram. The transistors Q11 and Q12, with the rectifiers CR11 and CR12 and the associated circuit elements, constitute the bistable flip-flop 20 of FIGURE 4. The rectifiers C13, C14 form the OR circuit 19. The AND control 18 consists of the application of the output voltage of the rectifiers C13, C14 to the transistor Q13 and to the transistor Q15. 62 is a direct current amplifier, and 63 an inductance suppressing high frequencies. The symbols 32, 31, 21, 33, and 15 have the same meaning as in FIGURE 4, the varactor being schematically represented by the element connected between the terminals 16 and 17. The continuous polarities indicated at various points of the diagram correspond to the frequency exploration by the sawtooth (unbracketed), or to synchronism (bracketed).

The transistors Q13 and Q14 with the associated elements constitute a multivibrator whose output pulses 61 are applied by the transistor Q16 to the integrating condenser C1. The transistor Q17 transmits the sawtooth $D(V_D=+3$ to $+12$ v.) supplied by the condenser C1 through the resistance $R_1$ to the terminal 17 of the varactor 16. The AND circuit 18 supplies at the point T through the transistor Q15 the order for conduction (+15 v.) or blocking (+2 v.) of the sawtooth at the transistor Q16. The action of the AND circuit 18 is also manifested at the point marked U, at the input of the multivibrator, in that it stops the generation of the pulses at the instant of the inoperative state. On the other hand, the bias (+15 v., +2 v.) applied to the input of the direct-current amplifier 62 supplies to the circuit of the phase discriminator 32 a bias ($V_1=+2.5$ v. during the conduction of the sawtooth and $V_2=-2$ v. during the blocking), which is transmitted through the direct conductive connection through the phase corrector 33 and the choke coil 63, to the terminal 16 of the varactor. When the sawtooth is applied, the bias of the varactor, equal to $(V_1-V_D)$, therefore varies between −0.5 and −9 v., which produces a frequency shift of the oscillator 15 by about a hundred kc./s. In the absence of the sawtooth, or state of synchronism, it is the fixed bias of (−2 v.−3 v.), i.e. −5 volts, which is applied. The reason for this is that, since the effective frequency in the absence of the sawtooth is outside the pass band of the medium-frequency amplifier, it can be maintained therein only by the action of the discriminator. The latter is very well capable of this, since it can supply a voltage of +10 volts. However, such operating conditions are marginal. The discriminator would then be almost at the limit of its range of operation *t* under normal operating conditions. In order to obviate this, there is applied to the varactor on one side a counter-bias of −2 v. which, when combined with the constant bias of +3 v. applied on the other side, supplies a fixed bias of −5 v., that is to say, the average between −0.5 and −9 v.

Another precaution has been taken to ensure good stability of synchronism at the time of the withdrawal of the sawtooth: if, at the instant of the blocking of the sawtooth, the integrating condenser C were suddenly discharged, this would result in a sudden change applied to the phase discriminator 32, which might destroy the synchonization. This difficulty is avoided by making the two transistors Q15 and Q16 non-conducting by application of the bias +3 v. The blocking impedance of these two silicon transistors is of the order of 100 megohms. The condenser C1 therefore discharges only across the input impedance of the follower-emitter Q17: the emitter load resistance of the transistor Q17 is brought to several megohms by the effect of the negative feedback. Consequently, the condenser C1, which is of high value (22$\mu$f.), of electromechanical type, is discharged mainly through its own loss resistance. This discharge takes place very slowly and lasts about 10 seconds. Likewise, the appearance of the bias $V_2=-2$ volts takes place with a substantially equal time constant. The change from the "exploration state" to the "servocontrol of the frequency" state therefore takes place progressively and without any sudden change.

As a result of these various arrangements, the conditions under which synchronism is established are combined owing to the application of the basic principles of the invention, and synchronism is absolutely maintained owing to the use of adequate technology.

We claim:

1. A frequency synthesizer including a frequency seeking and synchronizing device comprising a variable frequency oscillator means capable of generating a spectrum of frequencies within a prescribed band in response to a control signal, crystal controlled local oscillator means, modulator means for modulating the outputs of said variable frequency oscillator means and said local oscillator means to produce a medium frequency signal, said modulator means being capable of passing only signals falling within a prescribed frequency band, phase discriminator means for receiving the output of said modulator means and operative to produce an error signal in response to deviations of said medium frequency signal from a reference signal, phase shifting means for applying said error signal in control of the frequency of said variable frequency oscillator means, and gating means responsive only to zero output from said modulator means and to output from said phase discriminator means for applying a sawtooth voltage in control of said variable frequency oscillator.

2. A frequency synthesizer as defined in claim 1, wherein said gating means comprises means for deriving a first logical signal from detection of the output of said modulator means, means for inverting said first logical signal, flip-flop means responsive to said inverted first logical signal to control said gating means permitting application of said sawtooth voltage to said variable frequency oscillator, means for de-activating said flip-flop whenever said inverted first logical signal is reduced to zero and means for deriving a second logical signal from detection of said error signal, said second logical signal being effective until said error signal is reduced to zero to control said gating means so as to effect application of said sawtooth voltage to said variable frequency oscillator.

3. A frequency synthesizer as defined in claim 1, wherein said gating means comprises means for deriving a first logical signal from detection of said medium frequency signal, means for producing a second and third logical signal from detection of said error signal with a small and large time constant, respectively, means for inverting said first and third logical signals, means for combining said first and third logical signals, means for adding said second logical signal and the output of said combining means and flip-flop means for controlling the operation of said gating means in response to said first inverted logical signal and the output of said adding means.

References Cited by the Examiner

UNITED STATES PATENTS

| | | | |
|---|---|---|---|
| 2,594,263 | 4/52 | Munster | 331—4 |
| 2,631,239 | 3/53 | Lower | 331—4 X |
| 2,951,150 | 8/60 | Rennenkampf | 331—4 X |

ROY LAKE, *Primary Examiner.*

JOHN KOMINSKI, *Examiner.*